United States Patent
Verhulst et al.

(10) Patent No.: US 8,629,428 B2
(45) Date of Patent: Jan. 14, 2014

(54) LINE-TUNNELING TUNNEL FIELD-EFFECT TRANSISTOR (TFET) AND MANUFACTURING METHOD

(75) Inventors: Anne S. Verhulst, Houtvenne (BE); Kuo-Hsing Kao, Leuven (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 0 days.

(21) Appl. No.: 13/474,526

(22) Filed: May 17, 2012

(65) Prior Publication Data

US 2012/0298959 A1 Nov. 29, 2012

Related U.S. Application Data

(60) Provisional application No. 61/488,934, filed on May 23, 2011.

(30) Foreign Application Priority Data

Jul. 14, 2011 (EP) ..................................... 11173950

(51) Int. Cl.
*H01L 29/06* (2006.01)
(52) U.S. Cl.
USPC .......... 257/27; 257/39; 257/105; 257/E21.09; 438/164; 438/233; 438/283; 438/478; 977/700; 977/825; 977/890
(58) Field of Classification Search
USPC ............. 257/27, 39, 105, 288, 365, 394, 623, 257/900, E21.09, E29.245, E29.264; 438/164, 233, 283, 478; 977/700, 825, 977/890
See application file for complete search history.

(56) References Cited

U.S. PATENT DOCUMENTS

2006/0244077 A1 11/2006 Nowak
2008/0224224 A1 9/2008 Vandenderghe et al.

FOREIGN PATENT DOCUMENTS

EP 1 900 681 A1 3/2008

OTHER PUBLICATIONS

Jhaveri et al. "Effect of pocket doping and annealing schemes on the source-pocket tunnel field-effect transistor", IEEE Transactions on Electronic Devices vol. 58, 1 (Jan. 2011).
Vandenberghe et al. "Analytical model for a tunnel field-effect transistor", published IEEE Mediterranean, Electrotechnical Conference 2008, MELECON 2008, p. 4-1 to p. 4-4; 978-1-4244-1753-7/08/$25.00 ©2008 IEEE.
Ganapathi et al. "Analysis of InAs vertical and lateral band-to-band tunneling transistors: Leveraging vertical tunneling for improved performance" Applied Physics Letters 97, 033504 2010.

(Continued)

Primary Examiner — Mark A Laurenzi
(74) Attorney, Agent, or Firm — Knobbe Martens Olson & Bear, LLP

(57) ABSTRACT

A tunnel field effect transistor (TFET) and method of making the same is provided. The TFET comprises a source-channel-drain structure and a gate electrode. The source region comprises a first source sub-region which is doped with a first doping profile with a dopant element of a first doping type having a first peak concentration and a second source sub-region close to a source-channel interface which is doped with a second doping profile with a second dopant element with the same doping type as the first dopant element and having a second peak concentration. The second peak concentration of the second doping profile is substantially higher than the maximum doping level of the first doping profile close to an interface between the first and the second source sub-regions.

15 Claims, 10 Drawing Sheets

(56) References Cited

OTHER PUBLICATIONS

Hu et al. "Green Transistor—A VDD Scaling Path for Future Low Power ICs", pp. 14-15, published VLSI Technology, Systems and Applications, 2008. VLSI-TSA 2008. International Symposium on Apr. 21-23, 2008 , 978-1-4244-1615-8/08/$25.00 ©2008 IEEE.

Patel et al. "A Low Voltage Steep Turn-Off Tunnel Transistor Design" pp. 23-26, published Simulation of Semiconductor Processes and Devices, 2009. SISPAD '09. International Conference on Sep. 9-11, 2009, 978-1-4244-3947-8/09/$25.00 ©2009 IEEE.

FIG. 7 – prior art

LINE-TUNNELING TUNNEL FIELD-EFFECT TRANSISTOR (TFET) AND MANUFACTURING METHOD

CROSS-REFERENCE TO RELATED APPLICATIONS

This application claims the benefit under 35 U.S.C. §119 (e) of U.S. provisional application Ser. No. 61/488,934, filed May 23, 2011, and claims the benefit under 35 U.S.C. §119 (a)-(d) of European application No. 11173950.4, filed Jul. 14, 2011, the disclosures of which are hereby expressly incorporated by reference in their entirety and are hereby expressly made a portion of this application.

FIELD OF THE INVENTION

The embodiments relate to the field of semiconductor devices and nanotechnology. More specifically, the embodiments relate to tunnel field effect transistors (TFET) where the tunneling effect is based on band-to-band tunneling. Furthermore the embodiments relate to a method for manufacturing a semiconductor device, more particularly to a method for fabricating tunnel field effect transistors. More specifically the fabrication method relates to but is not limited to standard planar technology, double gate technology, FINFET technology and nanotechnology, wherein the latter includes implementations with integrated nanowires.

BACKGROUND OF THE INVENTION

Nanoelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g., due to short channel effects) and because it becomes difficult to decrease the supply voltage. The latter is mainly due to the fact that the subthreshold swing is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold swing can be less than 60 mV/dec, the physical limit of conventional MOSFETs, such that potentially lower supply voltages can be used. However, all-silicon TFETs typically suffer from low on-currents, a drawback related to the large resistance of the tunnel barrier.

In the past there have been different attempts to improve TFET performance.

For example Jhaveri et al. propose in "Effect of pocket doping and annealing schemes on the source-pocket tunnel field-effect transistor", IEEE Transactions on Electronic Devices Vol. 58, 1 (January 2011), a source-pocket TFET in order to improve the ON-current and the sub-threshold slope. For an nTFET an n+ pocket is implanted under the gate (the gate which is present above the intrinsic channel region only) in the p+-type source. As such a tunnel junction is formed between the p+ region and a narrow fully depleted pocket n+ region under the gate. Together, the p+ region and the n+ pocket region supply electrons to the channel. The fully depleted n+ pocket layer reduces the tunneling width and increases the electric field. This reduces the potential drop across the tunneling junction, thereby improving device performance.

Another possible TFET configuration is published by Vandenberghe et al. in "Analytical model for a tunnel field-effect transistor," published IEEE Mediterranean, Electrotechnical Conference 2008, MELECON 2008. They propose a new TFET configuration wherein the gate is located fully on top of the source. The gate does not cover the channel region of the TFET device. As such Band-To-Band Tunneling (BTBT) occurs in a direction orthogonal to the gate, referred to as line tunneling, whereas in conventional TFETs BTBT tunneling occurs via the channel region, also referred to as point tunneling.

There is still a need for further improved TFET design.

SUMMARY OF THE INVENTION

It is an object of certain embodiments to provide a tunnel Field Effect transistor (TFET) with improved performance thereby eliminating or at least drastically reducing the shift of the drain-source current $I_{DS}$ at an applied gate-source voltage $V_{GS}$ due to variations in drain-source voltage $V_{DS}$.

It is another object of certain embodiments to provide a method for manufacturing a tunnel Field Effect transistor (TFET) with good device properties, in particular for example a TFET with good $I_{DS}$-$V_{GS}$-characteristics, meaning with a subthreshold swing less than 60 mV/dec.

The above objectives are accomplished by a device and method according to certain embodiments.

Particular and preferred aspects of the invention are set out in the accompanying independent and dependent claims. Features from the dependent claims may be combined with features of the independent claims and with features of other independent claims as appropriate and not merely as explicitly set out in the claims.

In a first aspect, embodiments include a tunnel field effect transistor (TFET) comprising a source-channel-drain structure, a gate electrode and a gate dielectric. The source-channel-drain structure comprises at least one doped source region, at least one doped drain region and at least one channel region situated between the source region and the drain region, as such forming a source-channel interface with the source region and a drain-channel interface with the drain region. The source region comprises a first source sub-region which is doped with a first doping profile with a dopant element of a first doping type and having a first peak concentration, and further comprises a second source sub-region close to the source-channel interface, e.g., having a border between 0 and 5 nm from the interface, which is doped with a second doping profile with a second dopant element with the same doping type as the first dopant element and having a second peak concentration, and wherein an interface is defined between the first source sub-region and the second source sub-region and for which the peak concentration of the second doping profile is substantially higher than the maximum doping level of the first doping profile at or close to the interface, e.g., within a distance of up to 5 nm from the interface towards the first source sub-region, between the first and the second source sub-regions. The interface between the source sub-regions with the first and the second doping profile is defined as a surface or a depth location in the source region where the first doping profile and the second doping profile have the same doping level.

The gate electrode covers at least part of the source region along the longitudinal direction thereof such that there is no coverage by the gate electrode of the channel region nor of the drain region.

The gate dielectric is located along the longitudinal direction in between the gate electrode and the source region.

The second source sub-region may also be referred to as a pocket region of the source region.

According to certain embodiments the maximum doping level of the first doping profile close the interface between the first and the second source sub-regions is the maximum doping level of the first doping profile at a distance up to 5 nm from the interface towards the first source sub-region.

According to certain embodiments the maximum doping level of the first doping profile close to the interface between the first and the second source sub-regions is the doping level of the first doping profile at the interface between the first and the second source sub-regions.

According to certain embodiments the doping element of the first dopant element and the doping element of the second dopant element may be the same. The first dopant element and/or the second dopant element may preferably be chosen from any of the group comprising Boron (B), Aluminum (Al) in case of an n-TFET. The first dopant element and/or the second dopant element may preferably be chosen from any of the group comprising Phosphorus (Ph), Arsenic (As), Antimony (Sb) in case of a p-TFET.

According to certain embodiments the source region, i.e., the first and the second source sub-regions, of the TFET may be made of a semiconductor material which is p-type or n-type doped.

According to certain embodiments the drain region of the TFET may be made of a semiconductor material which is p-type or n-type doped.

The semiconductor material of the second source sub-region is preferably the same as the semiconductor material of the first source sub-region.

According to certain embodiments the second source sub-region is defined by a width W, the width W of the second source sub-region preferably being in the range of a monolayer to 10 nm. The width W of the second source sub-region is even more preferably in the range of 2 to 6 nm. The width W of the second source sub-region may be defined by the width of the second doping profile. For example if the second doping profile is a Gaussian profile the width W may be defined by the full width at half maximum (FWHM) of the Gaussian profile.

The source region has a surface adjacent the gate dielectric. According to certain embodiments the second source sub-region is located at a distance T from the surface adjacent the gate dielectric, the distance T thus being measured perpendicular to the longitudinal direction, the distance T preferably being in the range of 0 to 10 nm, for example in the range of 0 to 5 nm.

According to certain embodiments the second source sub-region, for example an edge of the second source sub-region closest to the source-channel interface, is located at a distance D from the source-channel interface, the distance D preferably being in the range of 0 to 10 nm, for example in the range of 0 to 5 nm.

A doping profile may be defined by a peak doping concentration and by a doping gradient or slope.

The first source peak concentration of the first source sub-region in the TFET may be in the range of $10^{18}/cm^3$ to $10^{21}/cm^3$, for example the peak doping concentration of the first source sub-region (i.e., the first doping level) may be in the range of $10^{19}/cm^3$ to $5 \times 10^{20}/cm^3$.

The drain peak concentration of the drain region in the TFET may be in the range of $10^{17}/cm^3$ to $10^{21}/cm^3$.

The second doping profile may also be defined by a second peak doping concentration. An optimum peak concentration for the second doping profile may dependent on different parameters, such as for example on the shape (i.e., width W, distance D and distance T) of the second doping profile of the second source sub-region, on the doping element of the second source sub-region, on the first doping profile (i.e., the first peak doping concentration, the first doping element and the first doping gradient towards the source-channel interface) of the first source sub-region, the desired on-current of the TFET device, . . . .

According to certain embodiments the second peak concentration is a factor 4 higher than the maximum doping level of the first doping profile at or close to the interface between the first and the second source sub-regions.

According to certain embodiments the channel region in the TFET may be made of a semiconductor material which is undoped or lowly doped (n or p doped) and which is situated in between the source and drain region.

The doping level of the channel region in the TFET may be in the range of undoped up to $10^{17}/cm^3$, for example the doping level of the channel region may be in the range of undoped up to $5 \times 10^{15}/cm^3$.

In the TFET According to certain embodiments, the overall semiconductor material, i.e., the basic material from which the (first and second) source sub-regions, channel region and drain region are formed may be selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof, or carbon nanotubes.

According to certain embodiments the gate electrode may partially or may completely cover the source region. Different examples are possible for a gate electrode only partially covering the source region. According to certain embodiments there may be an underlap $L_{underlap}$ being defined as the length of the source region which is not covered by the gate electrode. This underlap $L_{underlap}$ may be present at one side or both sides of the gate electrode, i.e., a first underlap at the source-channel interface side and/or a second underlap at the source-electrode side.

According to certain embodiments the gate electrode material may be made of a conductive material. The gate electrode material may be selected from at least one of polysilicon, polygermanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE). The gate electrode material may be chosen such that a particular gate work function is obtained.

The TFET According to certain embodiments may further comprise an electrical contact to the first source sub-region and to the drain region. The electrical contact on the first source sub-region and on the drain region may be a conductive material which may be selected from at least one of a silicide containing structure (NiSi, $CoSi_2$, $TiSi_2$, or the like), a germanide containing structure, a metal containing structure, polysilicon, or a combination thereof. The electrical contact on the source region and drain region may be a combination of a metal with a silicide.

According to a particular embodiment of the present invention the source-channel-drain structure may be a planar structure. In these embodiments, the gate electrode in the TFET may be a single gate structure situated on top of the source region of the planar source-channel-drain structure.

According to another embodiment of the invention the source-channel-drain structure may be a horizontal structure, i.e., a structure lying in the plane of the substrate, and the gate electrode may be a double gate structure situated on the sidewalls of the source region of the horizontal source-channel-drain structure.

According to another embodiment of the invention the TFET may be a triple-gate FET (e.g., FinFET). In these embodiments, the gate electrode may be a triple gate structure situated on the sidewalls and on top of the source region of the source-channel-drain structure of the triple-gate FET.

According to yet another embodiment of the invention the source-channel-drain structure may be a horizontal or vertical structure. In these embodiments, the gate electrode may be an all-around gate structure around the source of the horizontal or vertical source-channel-drain structure.

According to certain embodiments of the invention, the TFET may comprise a nanowire, also called a NW-TFET. The diameter of the nanowire, perpendicular to its longitudinal axis, may be in the range of 1 nm up to 500 nm, for example the diameter of the nanowire may be between 2 and 200 nm. The length of the nanowire, along its longitudinal axis used may be in the range of 5 nm and 50 µm, for example the length of the nanowire used in the TFET of the present invention may be between 10 nm and 1 µm.

According to certain embodiments of the invention, the TFET may be a NW-TFET which comprises a heterosection or a heterostructure. The length of the heterosection or heterostructure may be in the range of 1 nm and 50 nm, for example the length of the heterosection may be between 2 nm and 10 nm. The doping level of the heterosection in the TFET of the present invention may be in the range of $10^{18}/cm^3$ to $10^{21}/cm^3$, for example the doping level of the heterosection may be in the range of $10^{19}/cm^3$ to $5\times10^{20}/cm^3$. The heterosection or heterostructure comprise the second source sub-region.

In a second aspect, embodiments disclose a method for manufacturing a tunnel field effect transistor (TFET). The method comprises providing a drain region, a source region and a channel region on a semiconductor substrate. The drain region is made of a drain semiconductor material. The channel region is made of a lowly doped or undoped channel semiconductor material in contact with the drain region thereby forming a drain-channel interface between the drain region and the channel region. The source region is made of a source semiconductor material in contact with the channel region thereby forming a source-channel interface between the source region and the channel region. The method further comprises providing a gate electrode covering at least part of the source region along the longitudinal direction thereof such that there is no coverage by the gate electrode of the channel region nor of the drain region. The method further comprises providing a gate dielectric in between the gate electrode and the covered part of the source region. The method further comprises doping the source region and the drain region. Doping the source region comprises doping a first region of the source region, being referred to as the first source sub-region, with a first doping profile with a first dopant element having a first doping type and a first peak concentration and doping a second region of the source region, begin referred to as the second source sub-region, close to the source-channel interface with a second doping profile with a second dopant element having a second doping type being the same as the first doping type and with a second peak concentration being substantially higher than the maximum doping level of the first doping profile at or close to the interface between the first and the second source sub-regions.

The drain region is doped with a dopant element having the opposite doping type compared to the doping type of the source region, i.e., of the first and second doping type of the first and second source sub-regions respectively.

The first source sub-region and the drain region are selectively doped to a predetermined doping level (predetermined first peak concentration) and a predetermined dopant type. The first source sub-region may for example be doped to a p-type region and the drain region to an n-type region or vice versa.

According to certain embodiments the doping element of the first dopant element and the doping element of the second dopant element may be the same. The first dopant element and/or the second dopant element may preferably be chosen from any of the group comprising Boron (B), Aluminum (Al) in case of an n-TFET. The first dopant element and/or the second dopant element may preferably be chosen from any of the group comprising Phosphorus (Ph), Arsenic (As), Antimony (Sb) in case of a p-TFET.

According to certain embodiments the source region, i.e., the first and the second source sub-regions, of the TFET may be made of a semiconductor material which is p-type or n-type doped.

According to certain embodiments the drain region of the TFET may be made of a semiconductor material which is p-type or n-type doped.

The semiconductor material of the second source sub-region is preferably the same as the semiconductor material of the first source sub-region.

The first source peak concentration of the first source sub-region in the TFET may be in the range of $10^{18}/cm^3$ to $10^{21}/cm^3$, for example the peak doping concentration of the first source sub-region (i.e., the first doping level) may be in the range of $10^{19}/cm^3$ to $5\times10^{20}/cm^3$.

The drain peak concentration of the drain region in the TFET may be in the range of $10^{17}/cm^3$ to $10^{21}/cm^3$.

According to certain embodiments the channel region in the TFET may be made of a semiconductor material which is undoped or lowly doped (n or p doped) and which is situated in between the source and drain region. The doping level of the channel region in the TFET may be in the range of undoped up to $10^{17}/cm^3$, for example the doping level of the channel region may be in the range of undoped up to $5\times10^{15}/cm^3$.

The second source sub-region may also be referred to as pocket region. According to certain embodiments of the second inventive aspect the second peak concentration of the second source sub-region (pocket region) should be a factor 4 higher than the maximum doping level of the first doping profile at or close to the interface between the first and the second doping profile.

According to certain embodiments, source and drain contacts may be provided.

Furthermore a method for manufacturing a nanowire-TFET (NW-TFET) semiconductor device is disclosed. The method comprises the steps of providing on a substrate at least one drain contact onto which optionally a catalyst is deposited, growing a nanowire structure made of a semiconductor material, the nanowire having an integrated drain region, a channel region, and a source region, thereby forming a source-channel interface and a drain-channel interface, doping (selectively) a first sub-region of the source region to a desired first doping level and with a first dopant type, doping (selectively) the drain region, doping a second sub-region of the source region (being different from the first region) close to the source-channel interface with a second dopant element having the same doping type as the first dopant element and with a second peak concentration being substantially higher than the maximum doping level of the first doping profile at or close to the interface between the first and the second doping profile, optionally (selectively) doping the channel region, depositing at least partly on the side walls of the source region of the nanowire a gate dielectric (e.g., oxide), depositing on top of the gate dielectric (e.g., oxide) a gate electrode, the gate electrode being situated on the gate dielectric so as to not extend beyond the gate dielectric, the gate electrode covering at least part of the at least one source region of the source-channel-drain structure along the longitudinal direction such that there is no coverage by the gate electrode of the channel region or the drain region, forming a source contact on top of the source region of the nanowire.

For the application in tunnel field-effect-transistor devices the nanowire in a NW-TFET may form the channel and potentially also the source and drain regions of the tunnel field-effect transistor. Alternatively, either the source or drain regions of the tunnel field-effect transistor are situated in the substrate whereby the substrate comprises highly doped regions acting as source and drain regions.

The concept of the TFET of embodiments and other characteristics, features and advantages of the present invention are applicable to all types of TFET implementations, including but not limited to planar TFETs, double-gate TFETs, tri-gate TFETs (like FinFETs), and all-around TFETs, including but not limited to all horizontal and all vertical TFET implementations, including both implementations with a bulk contact and without a bulk contact.

The concept of the TFET of embodiments and other characteristics, features and advantages of the present invention are furthermore applicable to all TFETs independent of the channel doping, including both p-type channel doping, n-type channel doping and intrinsic doping.

The concept of the TFET of embodiments and other characteristics, features and advantages of the present invention are furthermore applicable to all TFET implementations, independent of the semiconductor material used as source material, as channel material, and as drain material, including TFETs with a source material which is different from the channel material and/or which is different from the drain material, including TFETs with a drain material which is different from the channel material. Possible semiconducting materials are including but not limited to group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, O or binary, tertiary or quaternary compounds thereof, or carbon nanotubes.

The concept of the TFET of embodiments and other characteristics, features and advantages of the present invention are furthermore applicable to all TFET implementations, independent of the gate dielectric material and thickness. Possible gate dielectric materials are including but not limited to silicon based oxides (e.g., silicon dioxide, silicon oxy nitride), aluminum oxide, high-k oxides (oxides, nitrided oxides, silicates and nitrided silicates of transition metals such as Hf, Ta, Ti, Nb, V, Y, Zr).

The above and other characteristics, features, and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

The high performance achieved for TFET devices according to certain aspects is an advantage compared to prior-art TFET device.

It is an advantage of the present invention that the spread of the onset voltage $V_{onset}$ (i.e., the gate voltage at which BTBT tunneling occurs) with variations in the source-drain voltage $V_{DS}$ can be reduced significantly especially for semiconductor devices According to certain embodiments with small gate dielectric thickness (i.e., smaller equivalent oxide thickness EOT).

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings. All figures are intended to illustrate some aspects and particular embodiments. The figures are depicted in a simplified way for reason of clarity. Not all alternatives and options are shown and therefore the invention is not limited to the content of the given drawings. Like numerals are employed to reference like parts in the different figures.

DETAILED DESCRIPTION OF ILLUSTRATIVE EMBODIMENTS

Figure 1:
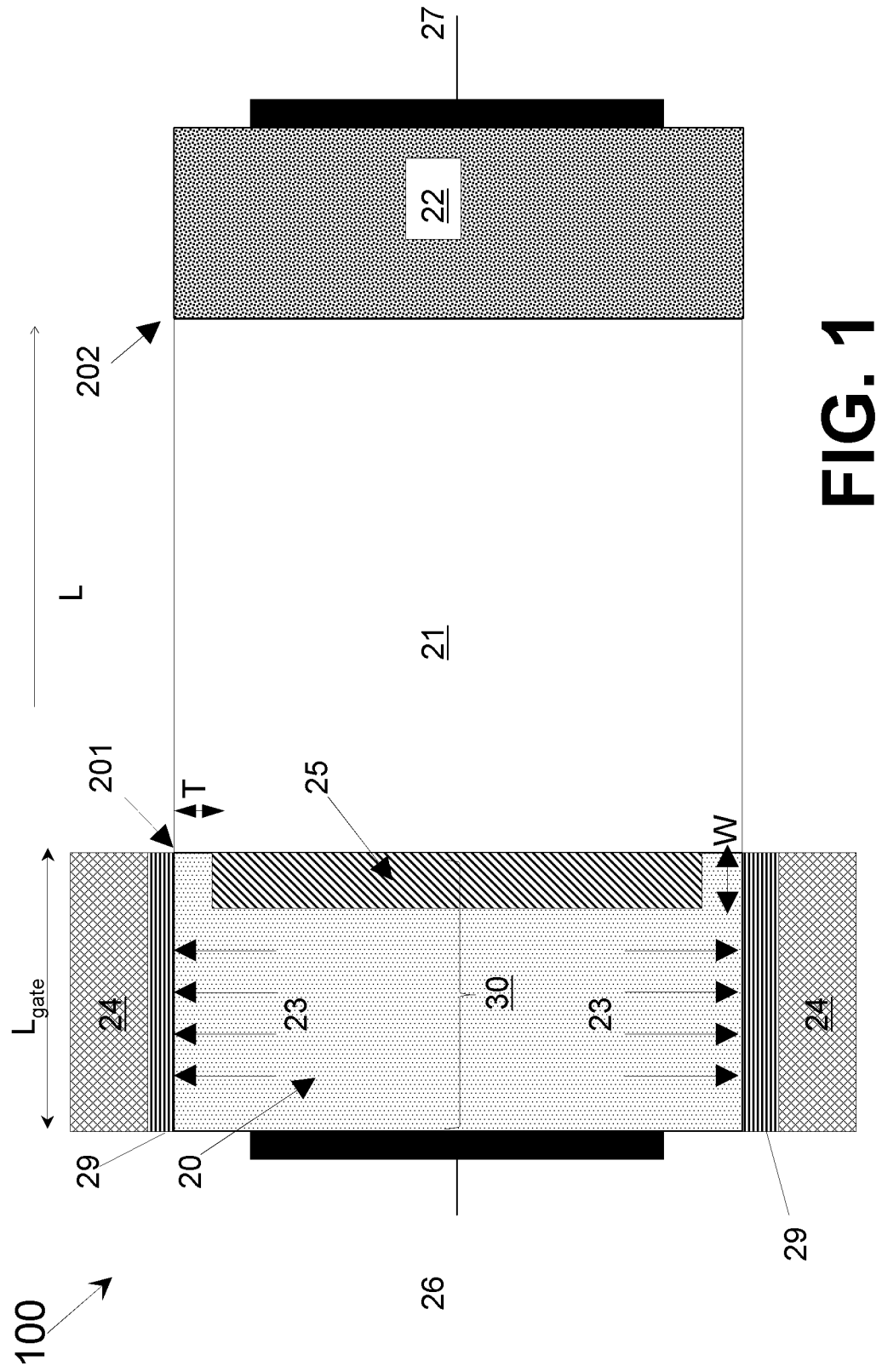
FIG. 1 illustrates a schematic representation of a cross-section of a TFET structure According to certain embodiments whereby the gate is only present on the source region and completely covers the source region of the TFET structure and whereby a pocket region is present in the source region adjacent to the source-channel interface. The four parallel arrows show the direction of the dominant tunneling event, which occurs in the direction orthogonal to the gate electrode.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary particular embodiments, various features of the invention are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed invention requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The invention will now be described by a detailed description of several particular embodiments. It is clear that other particular embodiments can be configured according to the knowledge of persons skilled in the art without departing from the technical teaching of the invention as defined by the appended claims.

When using the term "tunneling field effect transistor (TFET)" through the text, reference is made to a semiconductor device in which a gate controls a source-drain current through modulation of the so-called Band-To-Band Tunnelling (BTBT). Band-to-band tunneling is a process in which electrons tunnel from the valence band through the semiconductor bandgap to the conduction band or vice versa.

While some embodiments described herein include examples of a double-gate TFET device, more specifically a TFET device comprising for example a source-channel-drain structure in the plane of a semiconductor substrate, e.g., a horizontal source-channel-drain structure, and a double gate electrode situated on the sidewalls of the source region of the horizontal source-channel-drain structure, also other implementations of TFET devices may be applied In certain embodiments, such as for example a tri-gate TFET, an all-round gate TFET, a nanowire TFET, or the like. A tri-gate TFET comprises a source-channel-drain structure in the plane of a semiconductor substrate, e.g., a horizontal source-channel-drain structure, and a triple gate electrode comprising three gate electrode parts situated respectively on the sidewalls and on top of the source region of the horizontal source-channel-drain structure. A gate all-around TFET comprises a horizontal or a vertical source-channel-drain structure, i.e., a source-channel-drain structure in the plane of a substrate or substantially perpendicular to the plane of the substrate, and an all-around gate electrode situated around, i.e., surrounding or encircling, the source region of the horizontal or vertical source-channel-drain structure. A nanowire TFET comprises a nanowire which forms at least the channel region, and optionally the channel region and one or more of the source and drain regions, and an all-around gate electrode structure around, i.e., surrounding or encircling, the source region of the nanowire TFET.

While some embodiments described herein include examples of a nTFET, which means the semiconductor device comprises a p-type source (with a gate electrode at least partially surrounding the source region, e.g., a gate electrode located on or around the source region) and a n-type drain (also often referred to as a p-i-n diode TFET), also other implementations of TFET devices may be applied such as for example a pTFET, which means the semiconductor device comprises an n-type source (with a gate electrode at least partially surrounding the source regions, e.g., a gate electrode located on or around the source region) and a p-type drain.

In a first aspect of the invention a novel tunnel field effect transistor (TFET) device is disclosed having a "source only gate design". The TFET comprises a source-channel-drain structure comprising a doped source region, a doped drain region and a channel region situated between the doped source region and the doped drain region. The channel region forms a source-channel interface with the source region, and a drain-channel interface with the drain region. The TFET furthermore comprises a gate, comprising a gate electrode and a gate dielectric, whereby the gate electrode covers at least part of the source region of the TFET device and does not cover the channel region nor the drain region of the TFET device. This means line tunneling, where band-to-band tunneling takes place substantially perpendicularly to the gate electrode, is the main tunneling mechanism of the TFET device according to certain embodiments. The source region comprises at least two different regions, for example two different regions, each doped with dopant elements of a same dopant type, but with a different doping level, wherein the doping level of the region which is located nearest to the source-channel interface is substantially higher doped than the doping level of the other region further away from the source-channel interface.

Figure 7:
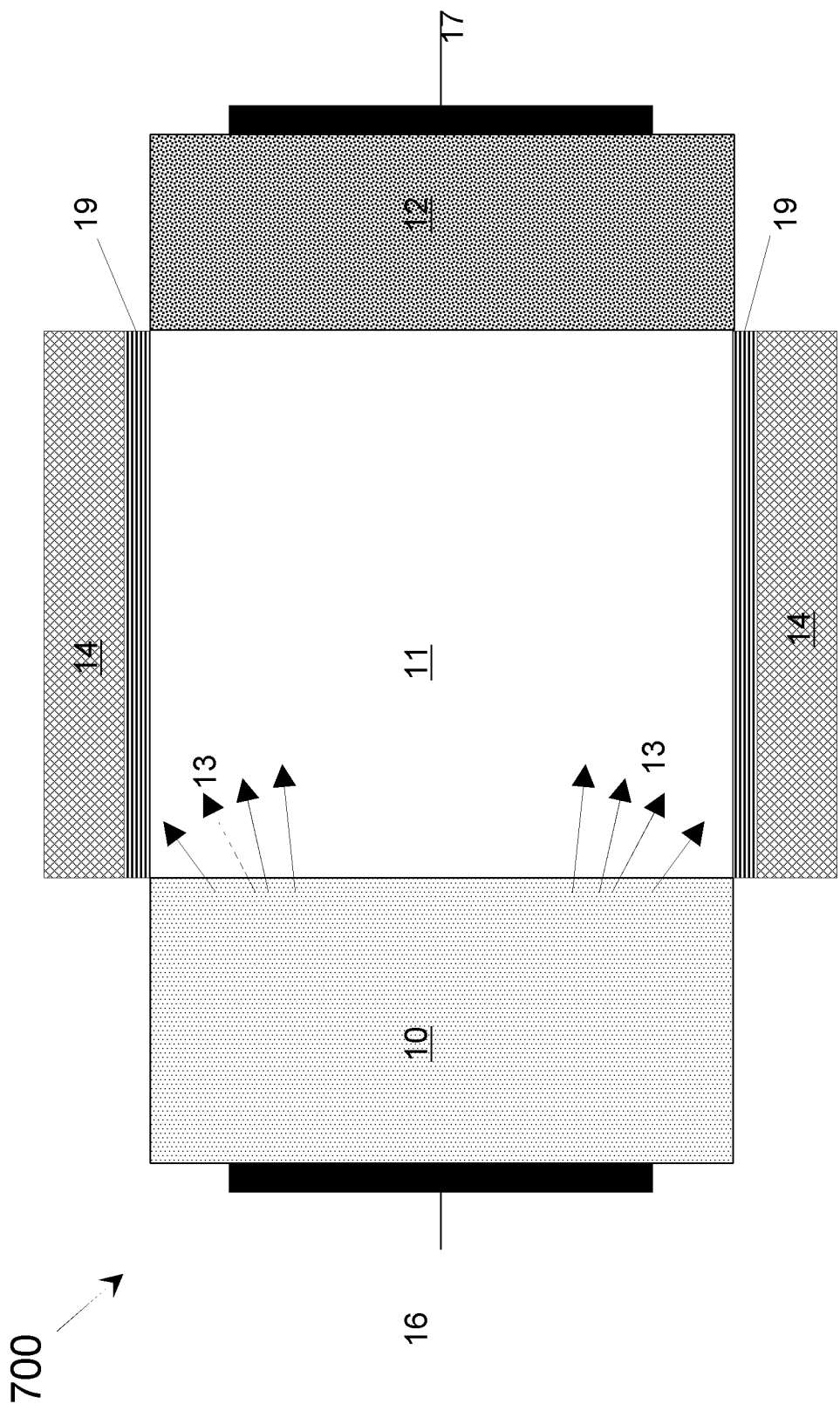
FIG. 7 illustrates a cross-section of a traditional TFET structure whereby the gate overlaps the channel region, possibly including a small overlap with the source and/or drain region (not shown). The arrows show the direction of the dominant tunneling effect, which is called point-to-point tunneling.

FIG. 7 illustrates a cross section of a traditional TFET structure 700 whereby the gate, comprising a gate dielectric 19 and a gate electrode 14 overlaps, with the whole channel region 11, optionally including (not shown) a small overlap with any or both of the source 10 and drain 12 regions of the TFET structure. The TFET structure as illustrated in FIG. 7 comprises a gate dielectric 19, at least between the source-channel-drain structure and the gate electrode 14. The TFET structure further comprises a source contact 16, and a drain contact 17. As the gate electrode is located on the channel region 11, the tunneling mechanism for TFET structures as illustrated in FIG. 7 is dominated by point tunneling between the source region 10 and the gate electrode 14 via the channel region 11 shown with the arrows 13.

FIG. 1 illustrates a cross-section of a TFET structure 100 according to an embodiment of the invention, the TFET structure comprising a source-channel-drain structure comprising a source region 30, a channel region 21 and a drain region 22 adjacent one another in longitudinal direction L of the device. Between the source region 30 and the channel region 21 a source-channel interface 201 is present. Between the drain region 22 and the channel region 21 a drain-channel interface 202 is present. The TFET structure as illustrated in FIG. 1 further comprises a gate electrode 24 which only overlaps with at least part of the source region 30. The source region 30 comprises a first source sub-region 20 and a second source sub-region 25. The gate electrode 24 does not overlap with the channel region 21 nor with the drain region 22. The TFET structure 100 in accordance with embodiments and as illustrated in FIG. 1 further comprises a gate dielectric 29 in between the gate electrode 24 and the source region 30. The second source sub-region 25 is located at the source-channel interface of the TFET structure and has a width W in longitudinal direction L of the TFET structure 100. The width W of the second source sub-region 25 may for example be between one monolayer and 10 nm. The second source sub-region 25 has the same dopant type as the first source sub-region 20, however the peak concentration in the second source sub-region 25 is substantially higher than the maximum doping level of the doping profile of the first source sub-region 20 at or close to the interface between the first and the second source sub-regions 20, 25. As the gate electrode 24 is located on the source region 30 only, the tunneling mechanism for the TFET structures as illustrated in FIG. 1 is dominated by line tunneling between the source region 30 and the gate electrode 24 shown with the arrows 23. The TFET structure 100 further comprises a source contact 26 electrically contacting the source region 30, and a drain contact 27 electrically contacting the drain region 22.

For example the first source sub-region 20 may have a sloped (for example Gaussian) doping profile with a tail towards the source-channel interface 201. The second source sub-region 25 is then preferably located near, e.g., adjacent to, the source-channel interface 201 with a doping level which is substantially higher than the maximum doping level of the doping profile in the first source sub-region 20 close to the interface between the first and the second source sub-regions 20, 25.

According to certain embodiments, the gate electrode 24 may overlap the source region 30 completely or may overlap only part of the source region 30. However, in accordance with embodiments, the gate electrode 24 may not overlap with the channel region 21 nor with the drain region 22 of the TFET device 100. By this configuration, line tunneling takes place rather than point tunneling.

Figure 2:
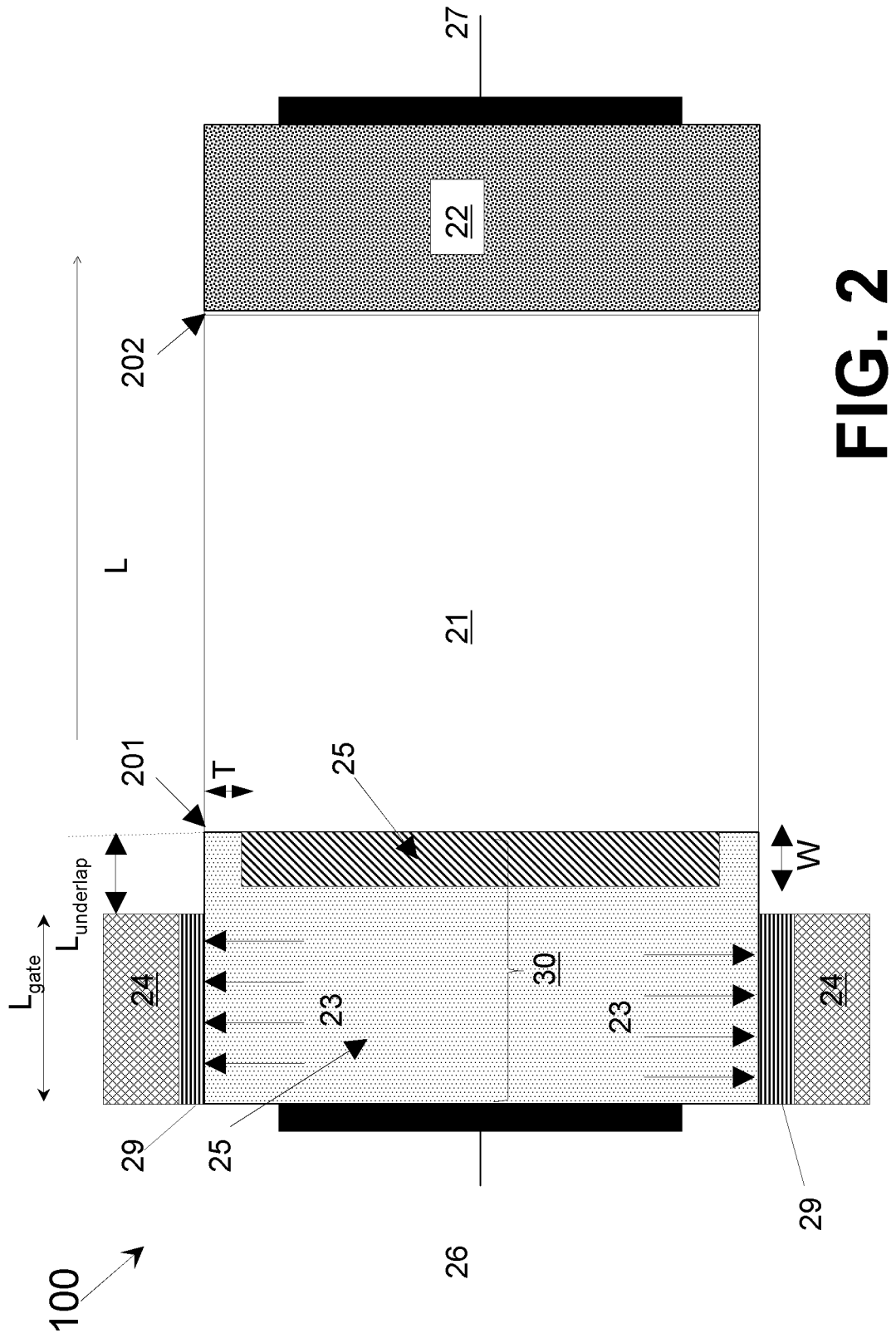
FIG. 2 illustrates a schematic representation of a cross-section of a TFET structure According to certain embodiments whereby the gate is only present on the source region and only partially covers the source region of the TFET structure with an underlap $L_{underlap}$ between the gate and the source-channel interface and whereby a pocket region is present in the source region adjacent to the source-channel interface. The 4 parallel arrows show the direction of the dominant tunneling effect, which occurs in the direction orthogonal to the gate electrode.

For embodiments wherein the gate electrode 24 only partially overlaps the source region 30, as for example illustrated in FIG. 2, an underlap $L_{underlap}$ may be defined, which is the distance of the source region 30 which is not overlapped by the gate electrode 24. Different examples are possible for a gate electrode 24 only partially covering the source region 30. The underlap $L_{underlap}$ may be present at one side or both sides of the gate electrode 24 in longitudinal direction L, i.e., a first underlap at the side of the source-channel interface 201 and/or a second underlap at the source 20, 25—source contact electrode 26 side. FIG. 2 illustrates an example of an underlap $L_{underlap}$ being for this example the distance between the gate electrode 24 and the source-channel interface 201.

The second source sub-region 25 may also be referred to as pocket region. Both first source sub-region 20 and second source sub-region 25 are doped with the same doping type, i.e., are both p-type (or alternatively n-type). The peak concentration of dopants, i.e., the maximum doping level, in the second source sub-region 25 should be substantially higher than the maximum doping level of the first doping profile close to the interface between the first and the second source sub-regions 20, 25. The peak concentration of the second source sub-region 25, also called the second peak concentration, should be preferably at least a factor 4 higher than the maximum doping level of the first doping profile at or close to, e.g., within 5 nm to 10 nm from the interface between the first and the second source sub-regions 20, 25. For example— in case of an abrupt, very steep first doping profile for the first source sub-region 20, the first source sub-region 20 may be doped substantially uniformly with dopants of a particular type, e.g., p-type dopants such as Boron, to a first peak concentration of 1e20/cm$^3$. The second source sub-region 25 may be doped with a same type of dopants, e.g., also p-type dopants such as Boron, to a doping level at least four times higher than the doping level of the first source sub-region 20, e.g., in the example given a dopant level of (at least) 4e20/cm$^3$. The maximum doping level of the doping profile in the first source sub-region 20 at or close to the interface between the first and the second source sub-regions 20, 25 may vary depending on the first doping profile characteristics (such as peak concentration, steepness of slope of the doping profile, or the like). Two examples are schematically shown in FIG. 9 and FIG. 10.

Figure 9:
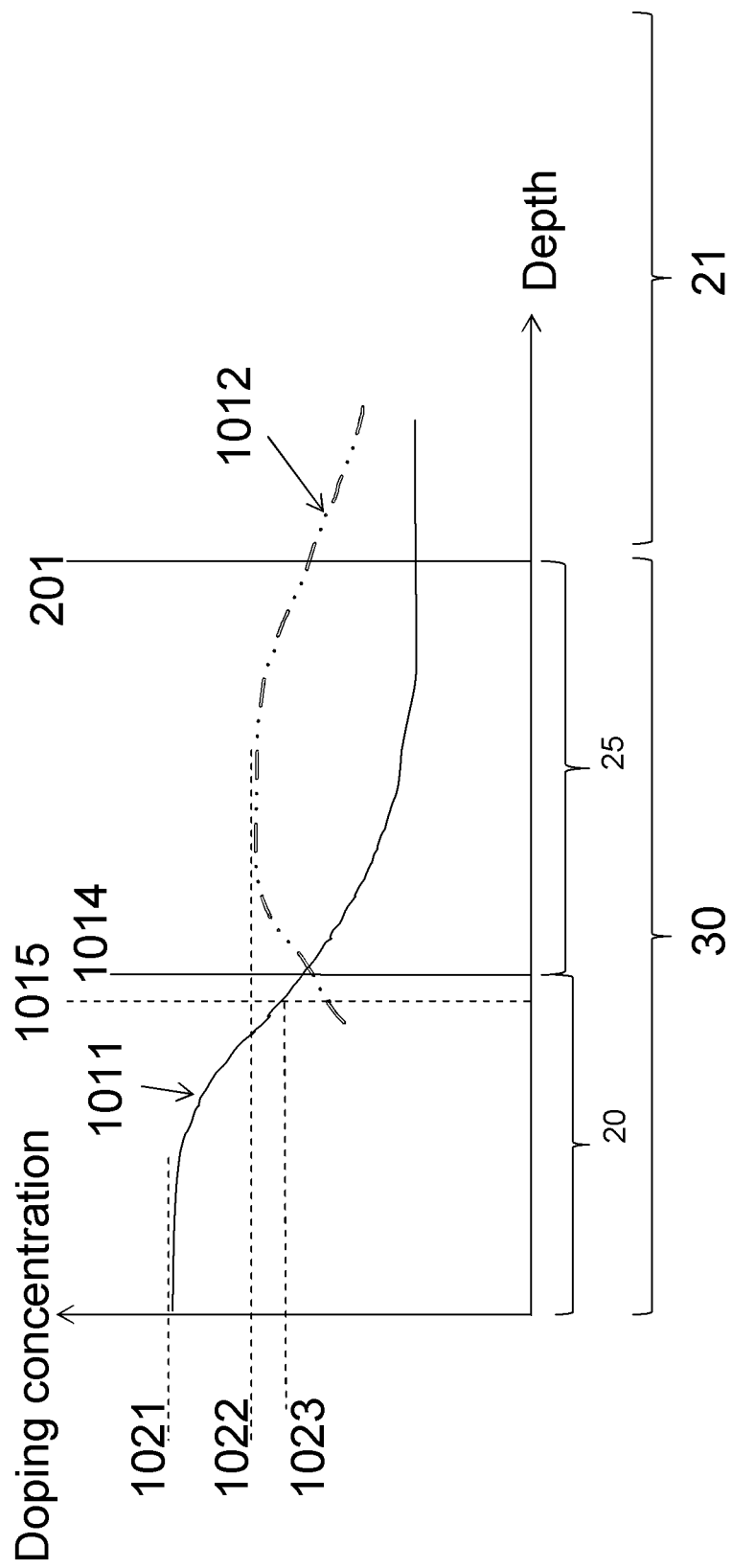
FIG. 9 and FIG. 10 illustrate a schematic doping profile curve in function of depth for the first source sub-region and second source sub-region According to certain embodiments for a less abrupt and more abrupt first doping profile of the first source sub-region, respectively.
Figure 10:
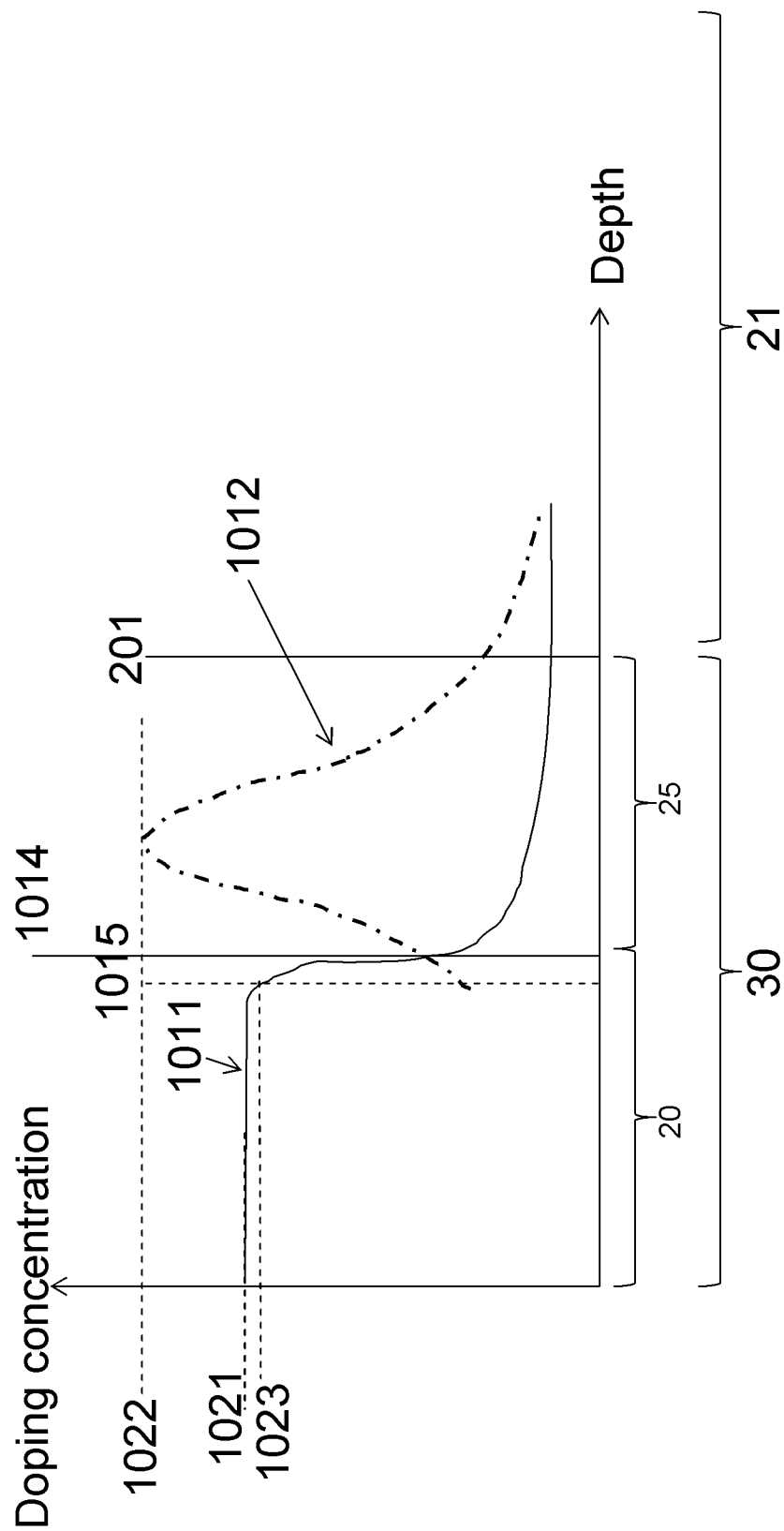

FIG. 9 and FIG. 10 schematically represent possible examples for the first and second doping profile of the first and second source sub-regions 20, 25 respectively, According to certain embodiments.

FIG. 9 shows a first doping profile 1011 with a first peak concentration 1021 in a first source sub-region 20 and a second doping profile 1012 with a second peak concentration 1022 in a second source sub-region 25. A source-channel interface 201 is shown as well as the interface 1014 between the first and the second source sub-regions. The second peak concentration 1022 should be higher than the maximum doping level of the first doping profile 1011 close to the interface 1014, here shown as the region between 1014 and 1015 wherein position 1015 is about 5 nm from the interface 1014. For this region in between position 1015 and interface 1014, a maximum doping level 1023 is defined. The second peak concentration 1022 must be substantially higher than the doping level 1023.

FIG. 10 shows a similar situation as FIG. 9; however the first doping profile 1011 of the first source sub-region 20 is a very abrupt doping profile, which can be seen by the steep slope of the profile 1011. Again, the second peak concentration 1022 of the second doping profile 1012 should be higher than the maximum doping level 1023 of the first doping profile 1011 close to the interface 1014 between the first and second source sub-regions 20, 25, here shown as the region between 1014 and 1015 wherein position 1015 is about 5 nm from the interface 1014. As a consequence the second peak concentration 1022 must be substantially higher than the first peak concentration 1021 of the first doping profile 1011.

In a TFET structure 100 According to certain embodiments, the drain region 22 is doped with an opposite doping type compared to the source region 30, e.g., n-type drain for a p-type source or vice versa. The doping level of the drain region 22 is preferably similar to the doping level of the first source sub-region 20, e.g., about 1e20/cm$^3$. The channel region 21 in between may be lowly doped or undoped, e.g., doped at a doping level of 1e12/cm$^3$ to 1e15/cm$^3$.

Due to the higher doping level of the second source sub-region 25 compared to the doping level of the first source sub-region 20, the influence of the drain-source voltage $V_{DS}$ may be better controlled. By using the second source sub-region 25 the shift in drain-source current $I_{DS}$ is less at an applied gate voltage $V_G$ with varying drain-source voltage $V_{DS}$ compared to prior art TFETs without such second source sub-region. This prevents tunneling of charge carriers from the source region 30 to the channel region 21 as such enhancing the point tunneling current and contributing to the total tunneling current. Otherwise said, the pocket region 25 forms a barrier for carriers (electrons or holes) to flow between the source region 30 and channel region 21.

Figure 3:
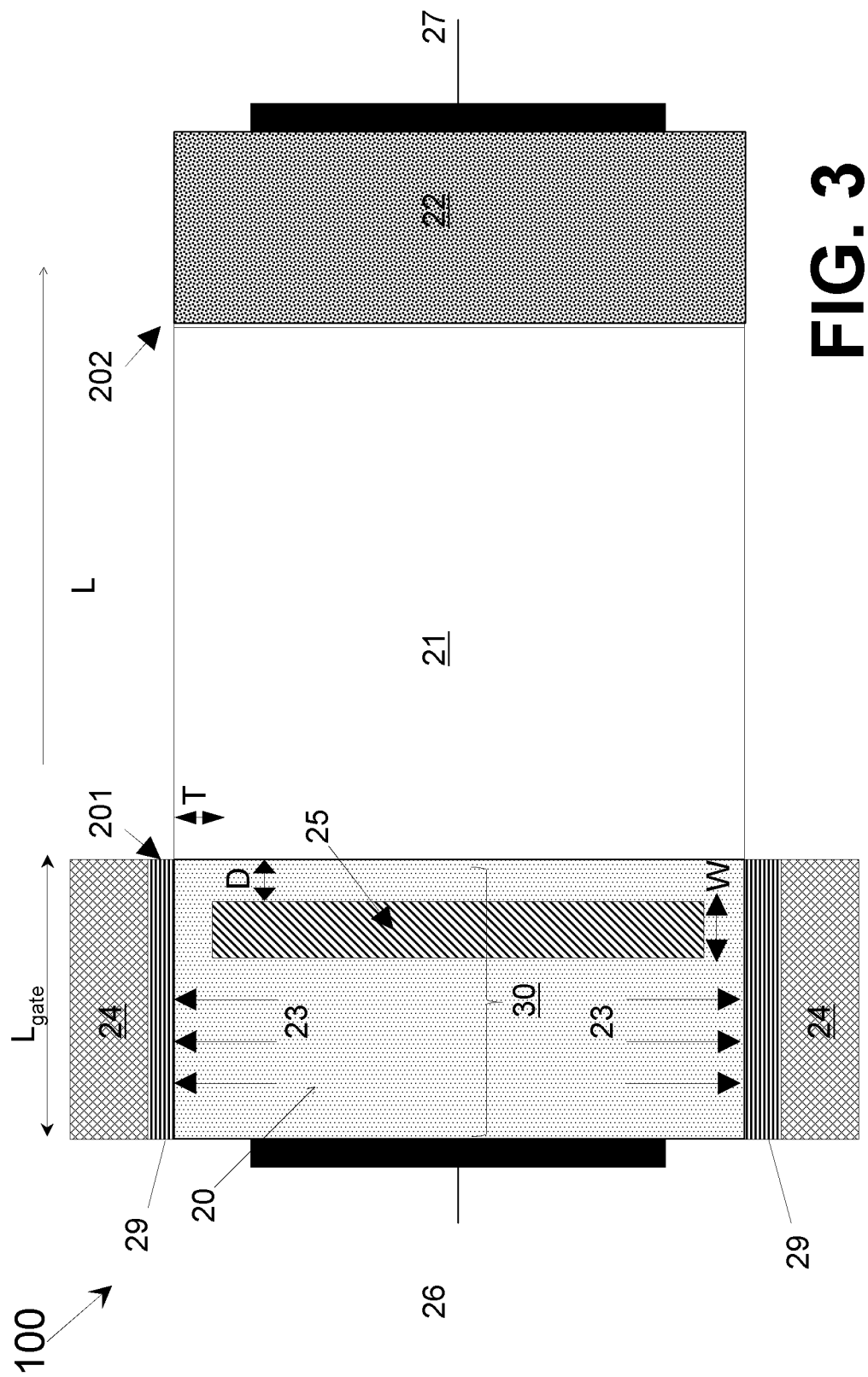
FIG. 3 illustrates a schematic representation of a cross-section of a TFET structure According to certain embodiments whereby the gate is only present on the source region and completely covers the source region of the TFET structure and whereby a pocket region is present in the source region close to but at a distance D from the source-channel interface. The 3 parallel arrows show the direction of the dominant tunneling effect, which occurs in the direction orthogonal to the gate electrode.

The second source sub-region 25 or pocket region may be located directly in contact with the source-channel interface 201 (as illustrated in FIG. 1 and FIG. 2) or may be located at a distance D from the source-channel interface 201 (as illustrated in FIG. 3).

In certain embodiments, the pocket region 25 is illustrated with a rectangular shape; however, this is only illustrative and also other more irregular shapes may be provided depending on the doping technique used. The second source sub-region 25 has a width W in longitudinal direction which may be in the range of a monolayer to 10 nm. The second source sub-region 25 may be, in a direction perpendicular to the longitudinal direction L, at a distance T from the gate dielectric 29. This distance T may be in the range of 0 to 10 nm, for example in the range between 0 to 5 nm, depending on the dimensions of the body (i.e., the dimensions of the source-channel-drain structure).

Doping the second source sub-region 25 may be done by techniques as known for a person skilled in the art. For a horizontal architecture of the TFET device 100, i.e., a TFET device of which the longitudinal direction L is lying substantially in the plane of a substrate, a first implantation may be performed to dope the first source sub-region 20 with a first doping level and a second implantation may be performed to additionally dope the second source sub-region 25 with a second doping level higher than the first doping level. For a vertical architecture of the TFET device, i.e., a TFET device of which the longitudinal direction L is placed substantially perpendicular to the plane of a substrate, the second source sub-region 25 may be formed by epitaxially growing a doped layer on top of the channel region 21 and thereafter another lower doped layer may be epitaxially grown on top of the second source sub-region 25 thereby forming the first source sub-region 20.

Figure 4:
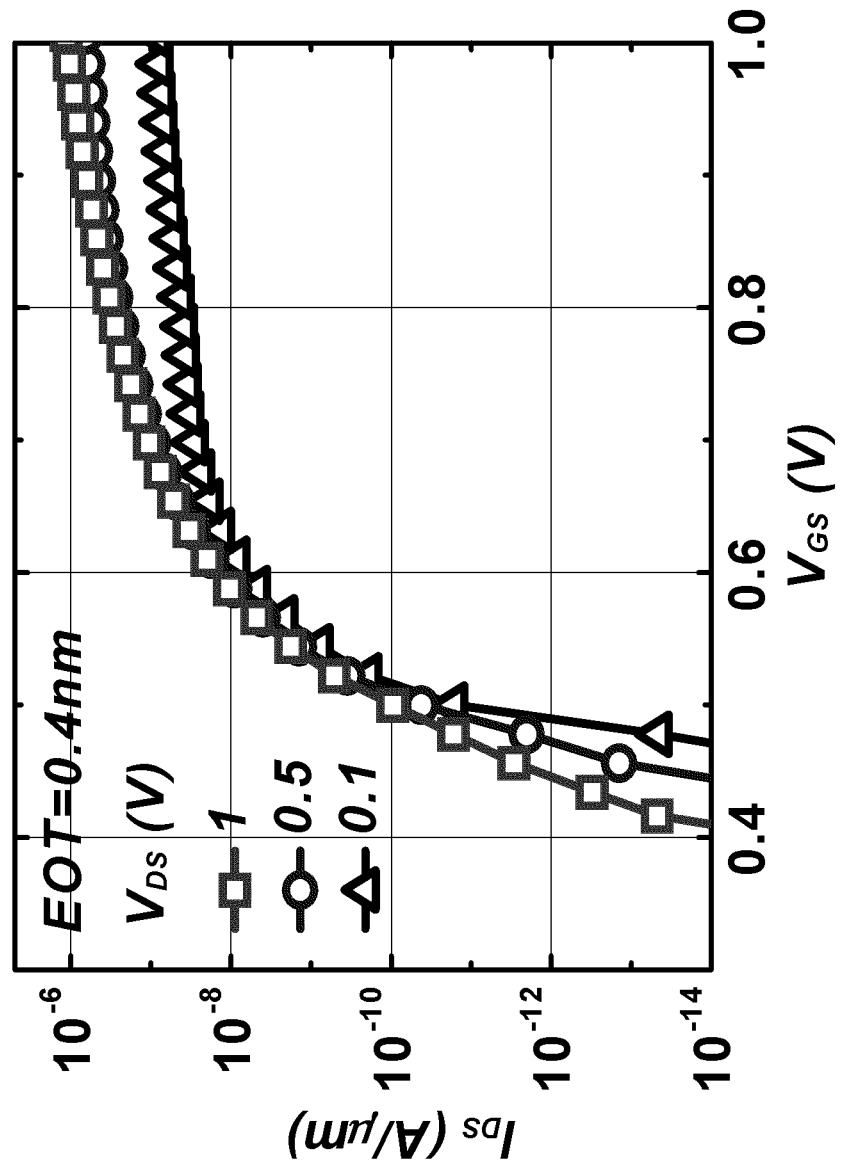
FIG. 4 illustrates simulated output characteristics for a TFET structure without a second source (pocket) region in the source region and with the gate only present on the source region (and thus not on the channel and/or drain region).
Figure 5:
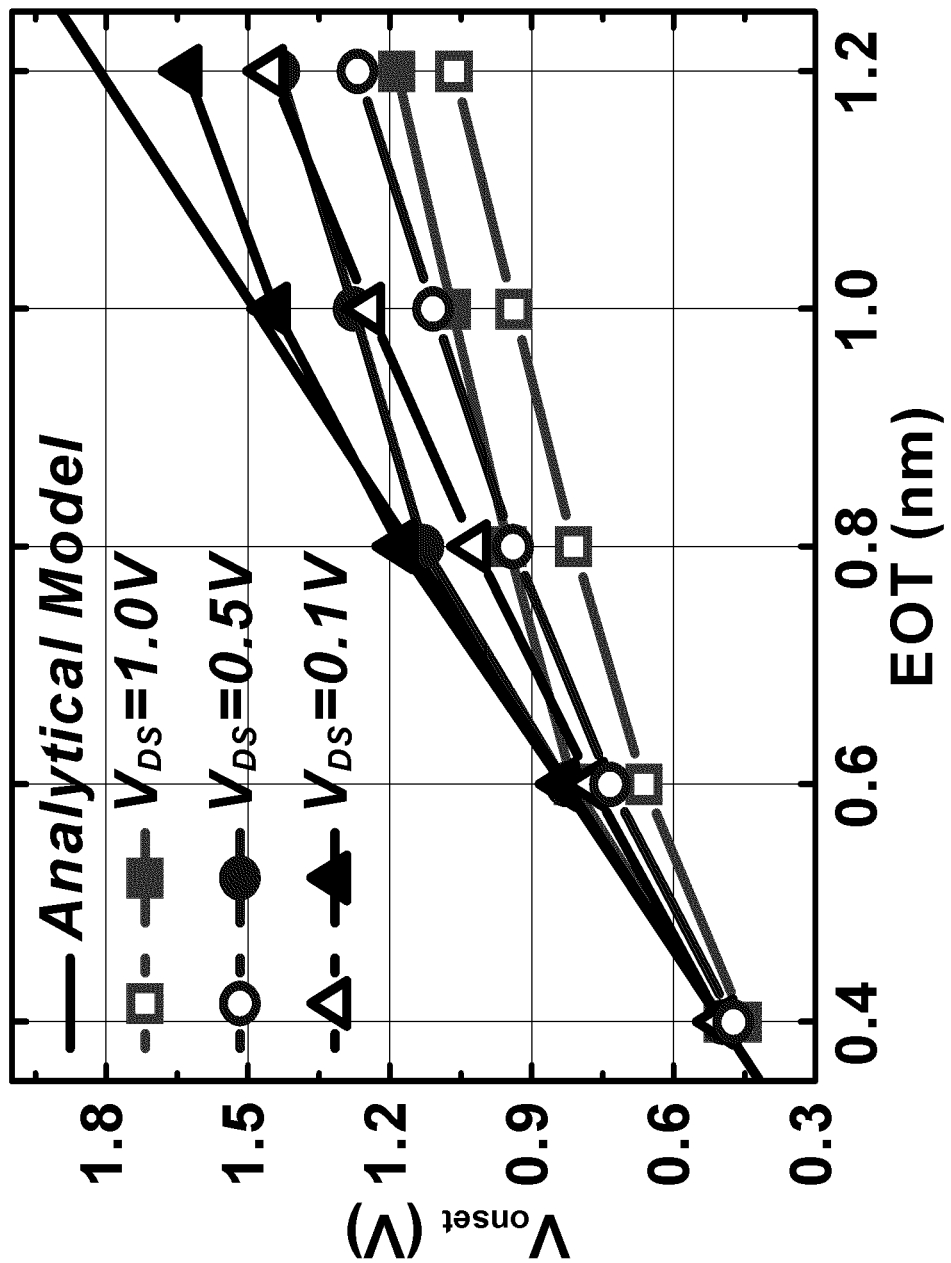
FIG. 5 illustrates simulated input characteristics for a TFET structure with a second (pocket) source sub-region (closed symbols) According to certain embodiments and without a second (pocket) source sub-region (open symbols).
Figure 6:
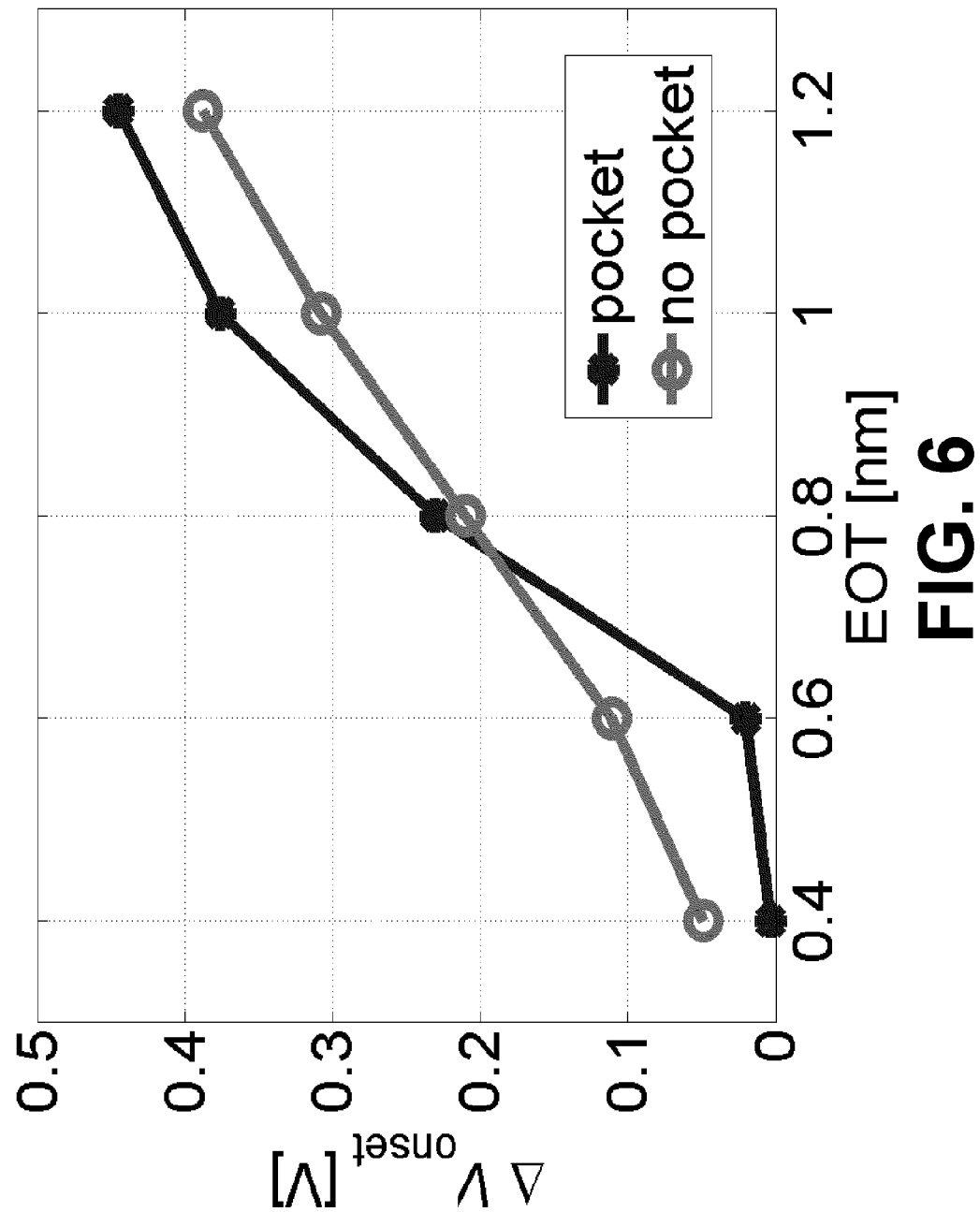
FIG. 6 illustrates simulated input characteristics for a TFET structure with a second (pocket) source sub-region (closed symbols) According to certain embodiments and without a second (pocket) source sub-region (open symbols).

Simulations as illustrated in FIG. 4, FIG. 5 and FIG. 6 are performed with device simulator Sentaurus Device from Synopsys® to determine the characteristics of a TFET structure 100 According to certain embodiments. The TFET structure 100 used for the simulation is shown in FIG. 1 with the gate electrode completely covering the source region 30. The TFET structure is 2-dimensional and is a double-gate structure with a gate at both sides (e.g., top and bottom as illustrated in FIG. 1) of the source region 30.

For the simulations, the height of the central part of the source region 30 (between the gate dielectrics 29) is 50 nm. The equivalent oxide thickness EOT of the gate dielectric 29 is varied from 0.4 nm up to 1.2 nm. The length of the channel region 21 is 40 nm, and the length of the gate 24 is 30 nm (no overlap with the channel region 21).

The most important dimensions in the TFET structure 100 to be taken into account for the electrical performance are the length of the gate $L_{gate}$ and the thickness and doping level of the second source sub-region (pocket region) 25. For example for the simulations as shown in FIG. 4, FIG. 5 and FIG. 6, the pocket region 25 is at a distance T in the range of 0 to 10 nm from the gate dielectric 29, has a width W of about 3 nm and is directly located at the source-channel interface 201 (D=0 nm).

Further parameters of importance are the doping of the (first and second) source sub-regions 20, 25 and of the drain region 22. The doping of the first source sub-region 20 is in the example p-type doping, the doping level is 1e20/cm$^3$. The doping of the second source sub-region 25 is in the example p-type doping, the doping level is 4e20/cm$^3$. The doping of the drain region 22 is in the example n-type doping, the doping level is 1e20/cm$^3$. The doping of the channel region 21 is not critical, as long as it is lowly doped. The doping level for the channel region used in this simulation example is n-type, 10$^{13}$/cm$^3$.

The reduced influence of the drain-source voltage $V_{DS}$ due to the presence of the higher doped second source sub-region 25 is illustrated also in FIG. 4, FIG. 5 and FIG. 6 which show simulated results for TFET structure According to certain embodiments.

FIG. 4 illustrates simulated output characteristics for a TFET structure without a second source sub-region in the source region and with the gate only present on the source region. FIG. 4 illustrates the drain currents $I_{DS}$ versus gate voltage $V_{GS}$ for different drain voltages $V_{DS}$. The source region consists of a first source sub-region only and has a doping level of $1e20/cm^3$. A gate dielectric is present in between the gate and the source region with an equivalent oxide thickness EOT of 0.4 nm. The drain region has a doping level of $1e20/cm^3$ and the channel region has a doping level of $1e13/cm^3$. At the smallest drain-source currents (below about 10e-9 A/μm) a shift is observed of the gate-source voltage $V_{GS}$ depending on the applied drain voltage $V_{DS}$. At a current of 1 pA/μm, the gate-source voltage $V_{GS}$ is shifted with approximately 50 mV when changing the drain voltage $V_{DS}$ from 0.1V up to 1V. The gate-source voltage $V_{GS}$ at 10 fA/um (onset voltage) is shifted approximately 0.1V when changing the drain voltage $V_{DS}$ from 0.1V up to 1V. This is however detrimental, hence not wanted, since it will influence the performance (negative impact) of the TFET in a circuit.

FIG. 5 illustrates simulated input characteristics for a TFET structure 100 with a second (pocket) source sub-region 25 (closed symbols). According to certain embodiments and compares these to input characteristics of a TFET structure without a second (pocket) source sub-region (open symbols). For both structures with or without a second (pocket) source sub-region, the gate 24 is only present on the source region 30. A 3 nm wide second (pocket) source sub-region 25 with a doping level of $4e20/cm^3$ is used. FIG. 5 illustrates the onset voltage $V_{onset}$, defined as the gate-source voltage required to obtain a current of 10 fA/μm, in function of the equivalent oxide thickness EOT of the gate dielectric 29 which is present in between the gate 24 and the source region 30 for different drain voltages $V_{DS}$ (0.1V, 0.5V and 1V). The spread in $V_{onset}$ for different drain voltages $V_{DS}$ is becoming smaller for smaller EOT. For the TFET structure 100 with a second (pocket) source sub-region 25 (closed symbols) the spread in $V_{onset}$ for different drain voltages $V_{DS}$ is almost negligible for an EOT smaller than 0.6 nm, whereas a spread in $V_{onset}$ for different drain voltages $V_{DS}$ is still visible (almost 0.3V) for the TFET structure without a second (pocket) source sub-region 25 (open symbols). It is thus seen that for a TFET structure 100 in accordance with embodiments with a second (pocket) source sub-region 25 the spread in $V_{GS}$ with varying drain-source voltage $V_{DS}$ becomes negligible for small EOT, i.e., for EOT smaller than 0.6 nm. Hence, $V_{onset}$ becomes independent of the drain voltage $V_{DS}$ for small EOT, i.e., for EOT smaller than 0.6 nm. For higher EOT values, i.e., for EOT higher than 0.6 nm, the spread of $V_{onset}$ is almost comparable for a TFET structure with or without a second (pocket) source sub-region 25. However, it is expected that upon proper optimization of the doping level and width of the pocket 25, it is also possible to obtain a smaller spread at higher EOT values, this is: it is expected that it is always possible to decrease the spread in the gate-source voltage upon varying the drain-source voltage by introducing a pocket in accordance with embodiments.

It is thus an advantage of embodiments that the onset voltage becomes independent of the applied drain voltages.

The spread of onset voltage $\Delta V_{onset}$ in function of the equivalent oxide thickness EOT of the gate dielectric present between the gate and the source region is illustrated in FIG. 6 (based on the data of FIG. 5). $\Delta V_{onset}$ is defined as the difference between the onset voltage at a drain voltage of 0.1V $V_{onset@VDS=0.1V}$ and the onset voltage at a drain voltage of 1V $V_{onset@VDS=1V}$. FIG. 6 illustrates simulated input characteristics for a TFET structure 100 with a second (pocket) source sub-region 25 (closed symbols) According to certain embodiments and without a second (pocket) source sub-region (open symbols). For both structures with or without a second (pocket) source sub-region 25, the gate 24 is only present on the source region 30. A 3 nm wide second (pocket) source sub-region 25 with a doping level of $4e20/cm^3$ is used. For smaller EOT values, i.e., for EOT values smaller than 0.6 nm, $\Delta V_{onset}$ can be significantly reduced (nearly becomes 0) for a TFET structure with a second (pocket) source sub-region 25 (closed symbols) According to certain embodiments.

In a second aspect, a method 300 is provided for manufacturing a TFET structure According to certain embodiments.

Figure 8:
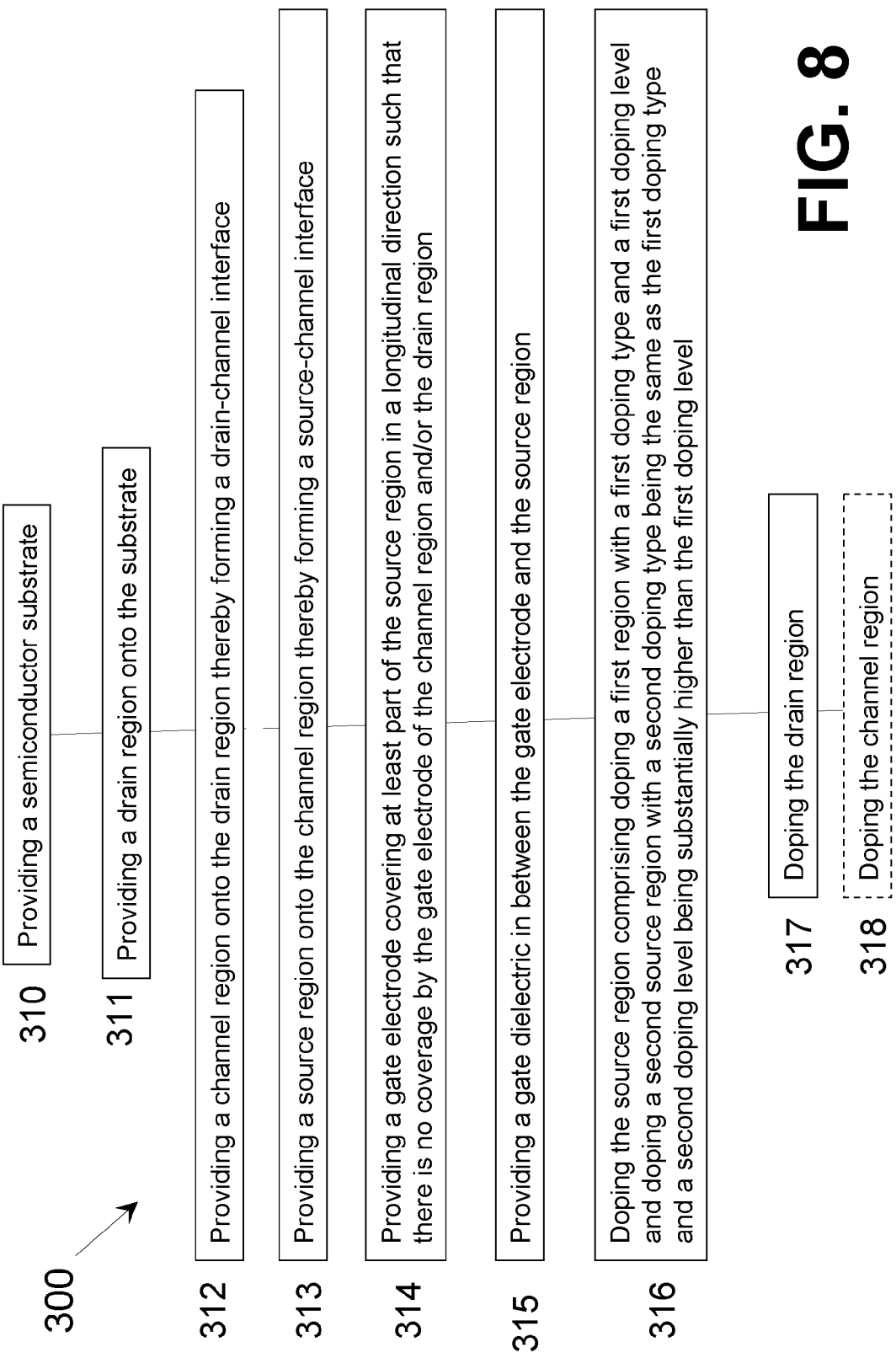
FIG. 8 illustrates a flowchart for a method of manufacturing a TFET structure according to a second aspect of the present invention.

A particular processing method to fabricate a TFET structure is illustrated in the flowchart shown in FIG. 8. Hereinafter, the method 300 according to an embodiment of the invention will be illustrated for a TFET comprising one (double) gate structure as shown in FIG. 1 (cross section). It has to be understood that this is not limiting the invention and that the method may also be applied to create alternative TFET structures (e.g., comprising a nanowire, a second gate structure, or the like) in accordance with embodiments, for example as described above.

In a first step 310, a substrate is provided. Preferably the substrate is a semiconductor substrate such as a silicon substrate or a silicon on insulator (SOI) substrate but any other suitable substrate can be used as well such as, for example, glass, ceramics, etc.

According to certain embodiments a source-channel-drain structure having at least one n (or p) doped drain region 22, one channel region 21, and one p (or n) doped source region 30 comprising a first and second doped source sub-region 20, 25 is formed. Deposition techniques such as, for example, CVD (Chemical Vapor Deposition), MOCVD (Metal Organic Chemical Vapor Deposition), or PECVD (plasma enhanced chemical vapor deposition) processes can be used. Alternatively etching techniques can be used whereby the structures are etched into the substrate.

The different regions with different doping levels and different doping types need to be created to form the drain region 22, the channel region 21 and the source region 30 (first and second source sub-regions 20, 25) in the source-channel-drain structure. These different regions can be doped during the deposition process to obtain an n-type or p-type region. Alternatively, the doping may be performed after the deposition step by means of an additional doping step—as illustrated for example in steps 316, 317, 318 of the method. The doping in one specific region, e.g., first source sub-region 22, second source sub-region 25 or drain region 22 may be uniform, or may alternatively have a non-uniform doping profile. Doping the source region 30 comprises doping a first source sub-region 20 with a first doping type and a first doping level and doping a second source sub-region 25 with a second doping type being the same as the first doping type and with a second doping level being substantially higher than the first doping level.

In the embodiment illustrated in FIG. 8, the source-channel-drain structure created is a vertical structure. A drain region 22 is created on the substrate—step 311. The drain region 22 may be made of a first semiconductor material which is highly n doped in case of an n-type TFET, or alternatively in case of a p-type TFET the drain region 22 is highly p doped. In certain embodiments, the doping level of the drain region 22 is in the range of $1e18/cm^3$ to $1e21/cm^3$, for example in the range of $1e19/cm^3$ to $5e20/cm^3$.

The channel region 21 of the TFET is formed onto the drain region 22, thereby forming a drain-channel interface 202—step 312. In certain embodiments, the channel region 21 may preferably be made of the first semiconductor material, although other suitable/compatible materials can be used. In certain embodiments, the doping level of the channel region 21 may be in the range of undoped up to $1e17/cm^3$ doping, for example in the range of undoped up to $1e14/cm^3$ doping.

A source region 30 is created next to the channel region 21, thereby forming a source-channel interface 201—step 313. The source region 30 may be made of the first semiconductor material, although other suitable/compatible materials can be used. The semiconductor material may be highly p doped in case of an n-type TFET (or alternatively in case of a p-type TFET the source region 30 may be highly n doped). The source region 30 comprises a first source sub-region 20 with a first doping type and doping level and a second source sub-region 25 with a second doping type being the same as the first doping type and with a second doping level being substantially higher than the first doping level. The doping level of the first source sub-region 20 may be in the range of $1e18/cm^3$ to $1e21/cm^3$, for example in the range of $1e19/cm^3$ to $5e20/cm^3$. The doping level of the second source sub-region 25 may be in the range of $5e18/cm^3$ to $4e21/cm^3$, for example in the range of $2e19/cm^3$ to $1e21/cm^3$.

Depending on whether an n-TFET or p-TFET, different dopant types may be used for the source region 30 and/or drain region 22. For a Si-based TFET, possible p-type dopants are B, Al, Ga, In, TI, Pd, Na, Be, Zn, Au, Co, V, Ni, MO, Hg, Sr, Ge, Cu, K, Sn, W, Pb, O, Fe; and possible n-type dopants are Li, Sb, P, As, Bi, Te, Ti, C, Mg, Se, Cr, Ta, Cs, Ba, S, Mn, Ag, Cd, Pt. Fro a Ge-based TFET, possible p-type dopants are B, Al, TI, Ga, In, Be, Zn, Cr, Cd, Hg, Co, Ni, Mn, Fe, Ptl; and possible n-type dopants are Li, Sb, P, As, S, Se, Te, Cu, Au, Ag.

In step 314 a gate electrode 24 is formed on the source region 30, covering at least part of the source region 30 in a longitudinal direction L such that there is no coverage by the gate electrode 24 of the channel region 21 nor of the drain region 22, more specifically a single gate, double gate or triple gate structure can be formed depending on the type of TFET (planar, MUGFET, horizontal, or the like). First a gate dielectric (e.g., oxide) 29 is deposited-step 315. The gate dielectric 29 is at least situated below the whole length of the gate electrode 24 but can cover up to the whole length of the TFET structure, i.e., of the underlying source-channel-drain structure. Then, in step 314, a gate electrode 24 is deposited on top of the gate dielectric 29.

The gate dielectric 29 may be selected from at least one of silicon based oxides (e.g., silicon dioxide, silicon oxy nitride), aluminum oxide, high-k oxides (oxides, nitrided oxides, silicates and nitrided silicates of transition metals such as Hf, Ta, Ti, Nb, V, Y, Zr). In particular embodiments the gate dielectric is a high-k oxide such as hafnium oxide. The thickness of the gate dielectric 29, e.g., gate oxide, is preferably in the range of 0.5 nm to 20 nm.

The gate electrode 24 may be made of a conductive material, for example selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular embodiments the gate electrode 24 is made of a metal of which the workfunction has been engineered specifically for the chosen channel material 21, the gate dielectric material, gate dielectric thickness and channel doping.

Additionally an electrical contact 26, 27 may be formed on the source region 30 and/or on the drain region 22. The electrical contact 26, 27 may be a conductive material which is selected from at least one of a silicide containing structure (NiSi, $CoSi_2$, $TiSi_2$, or the like), a germanide containing structure, a metal containing structure, poly silicon or a combination thereof. In particular embodiments the electrical contact may be a combination of a metal with a silicide. Also disclosed are contacts, formed of e.g., conductive oxides and even conductive polymers. In a particular embodiment, the source and/or drain contact 27 may be a silicide containing structure.

What is claimed is:

1. A tunnel field effect transistor comprising:
a source-channel-drain structure comprising a doped source region, a doped drain region, a channel region situated between the source region and the drain region, a source-channel interface, and a drain-channel interface, wherein the doped source region comprises a first source sub-region which is doped with a first doping profile with a dopant element of a first doping type and which has a first peak concentration, the doped source region further comprising a second source sub-region close to the source-channel interface which is doped with a second doping profile with a second dopant element with the same doping type as the first dopant element and which has a second peak concentration, and wherein the doped source region comprises an interface between the first source sub-region and the second source sub-region, wherein the second peak concentration of the second doping profile is substantially higher than a maximum doping level of the first doping profile at or close to the interface between the first source sub-region and the second source sub-region;
a gate electrode which covers at least a part of the source region along a longitudinal direction of the source region such that there is no coverage by the gate electrode of the channel region or the drain region;
a gate dielectric along the longitudinal direction of the source region, wherein the gate dielectric is situated between the gate electrode and the source region.

2. The tunnel field effect transistor of claim 1, wherein the second source sub-region is at a distance of from 0 to 5 nm from the source-channel interface.

3. The tunnel field effect transistor of claim 1, wherein the second source sub-region has a width of from a monolayer to 10 nm.

4. The tunnel field effect transistor of claim 1, wherein the source region has a surface adjacent to the gate dielectric, wherein the second source sub-region is located at a distance from the surface adjacent to the gate dielectric of 0 to 10 nm.

5. The tunnel field effect transistor of claim 1, wherein the second source sub-region is located at a distance from the source-channel interface of 0 to 10 nm.

6. The tunnel field effect transistor of claim 1, wherein second peak concentration is a factor of 4 higher than the maximum doping level of the first doping profile at or close to the interface between the first source sub-region and the second source sub-region.

7. The tunnel field effect transistor of claim 1, wherein the gate electrode completely covers the source region.

8. The tunnel field effect transistor of claim 1, wherein the gate electrode partially covers the source region, leaving an underlap which is defined by a length of the source region which is not covered by the gate electrode.

9. The tunnel field effect transistor of claim 1, wherein the source-channel-drain structure is a planar source-channel-drain structure, and wherein the gate electrode is a single gate structure situated on top of the source region of the planar source-channel-drain structure.

10. The tunnel field effect transistor of claim 1, wherein the source-channel-drain structure is a horizontal source-channel-drain structure, and wherein the gate electrode is a double gate structure situated on sidewalls of the source region of the horizontal source-channel-drain structure.

11. The tunnel field effect transistor of claim 1, wherein the source-channel-drain structure is a horizontal source-channel-drain structure or a vertical source-channel-drain structure, and wherein the gate electrode is an all-around gate structure situated around the source region of the horizontal source-channel-drain structure or the vertical source-channel-drain structure.

12. The tunnel field effect transistor of claim 1, wherein the tunnel field effect transistor comprises a nanowire, wherein the nanowire forms at least the channel of the tunnel field effect transistor, and wherein the gate electrode is an all-around gate structure.

13. A method for manufacturing the tunnel field effect transistor of claim 1, comprising:
 providing a semiconductor substrate;
 providing a drain region on the substrate, the drain region comprising a drain semiconductor material;
 providing a channel region comprising a lowly doped or undoped channel semiconductor material in contact with the drain region, whereby a drain-channel interface between the drain region and the channel region is formed;
 providing a source region comprising a source semiconductor material in contact with the channel region, whereby a source-channel interface between the source region and the channel region is formed; and
 providing a gate electrode covering at least a part of the source region along a longitudinal direction of the source region, such that there is no coverage by the gate electrode of the channel region or of the drain region;
 providing a gate dielectric between the gate electrode and the covered part of the source region; and
 doping the source region and the drain region, wherein doping the source region comprises doping a first source sub-region with a first doping profile with first dopant element having a first doping type and a first peak concentration and doping a second source sub-region close to the source-channel interface with a second doping profile with a second dopant having a second doping type that is the same as the first doping type and with a second peak concentration, wherein the second peak concentration is substantially higher than a maximum doping level of the first doping profile close to the interface between the first source sub-region and the second source sub-region.

14. The method of claim 13, wherein the second peak concentration is a factor of 4 higher than the maximum doping level of the first doping profile close to the interface between the first source sub-region and the second source sub-region.

15. The method of claim 13, wherein the tunnel field effect transistor is a nanowire tunnel field effect transistor semiconductor device, and wherein providing a source-channel-drain structure comprises growing a nanowire structure made of a semiconductor material.

* * * * *